United States Patent
Murphy et al.

(10) Patent No.: US 7,417,297 B2
(45) Date of Patent: Aug. 26, 2008

(54) FILM OR LAYER OF SEMICONDUCTING MATERIAL, AND PROCESS FOR PRODUCING THE FILM OR LAYER

(75) Inventors: Brian Murphy, Pfarrkirchen (DE); Reinhold Wahlich, Tittmoning (DE); Rüdiger Schmolke, Burghausen (DE); Wilfried Von Ammon, Hochburg/Ach (AT); James Moreland, Portland, OR (US)

(73) Assignee: Siltronic AG, Munich (DE)

( * ) Notice: Subject to any disclaimer, the term of this patent is extended or adjusted under 35 U.S.C. 154(b) by 99 days.

(21) Appl. No.: 11/384,887

(22) Filed: Mar. 20, 2006

(65) Prior Publication Data

US 2006/0202310 A1   Sep. 14, 2006

Related U.S. Application Data

(62) Division of application No. 10/481,537, filed as application No. PCT/EP02/07125 on Jun. 27, 2002, now Pat. No. 7,052,948.

(30) Foreign Application Priority Data

Jun. 28, 2001 (DE) .................. 101 31 249

(51) Int. Cl.
*H01L 29/06* (2006.01)
(52) U.S. Cl. ............... 257/506; 257/347; 257/499; 257/618; 257/E27.001
(58) Field of Classification Search ................ 257/347, 257/499, 506, 618
See application file for complete search history.

(56) References Cited

U.S. PATENT DOCUMENTS

| | | | |
|---|---|---|---|
| 5,374,564 A | 12/1994 | Bruel | |
| 5,854,123 A | 12/1998 | Sato et al. | |
| 5,935,320 A | 8/1999 | Graef et al. | |
| 5,966,620 A | 10/1999 | Sakaguchi et al. | |
| 6,020,252 A | 2/2000 | Aspar et al. | |
| 6,143,629 A | 11/2000 | Sato | |
| 6,146,979 A | 11/2000 | Henley et al. | |
| 6,225,192 B1 | 5/2001 | Aspar et al. | |
| 6,326,279 B1 | 12/2001 | Kakizaki et al. | |
| 6,489,217 B1 | 12/2002 | Kalnitsky et al. | |

(Continued)

FOREIGN PATENT DOCUMENTS

EP  0 553 852  8/1993

(Continued)

OTHER PUBLICATIONS

Tsunashima, Y. et al, A New Substrate Engineering Technique to Realize Silicon on Nothing (SON) Structure Utilizing Transformation of Sub-Micron Trenches to Empty Space in Silicon (ESS) by Surface Migration, Electrochemical Society Proceedings, 17, 2000, p. 532-545.

(Continued)

*Primary Examiner*—Wael Fahmy
*Assistant Examiner*—Christy L Novacek
(74) *Attorney, Agent, or Firm*—Brooks Kushman P.C.

(57) ABSTRACT

SOI wafers are manufactured to have very thin device layers of high surface quality. The layer is $\leq 20$ nm in thickness, has an HF density of $\leq 0.1/cm^2$, and a surface roughness of 0.2 nm RMS.

10 Claims, 4 Drawing Sheets

U.S. PATENT DOCUMENTS

| | | | |
|---|---|---|---|
| 6,593,211 B2 | 7/2003 | Sato | |
| 6,613,678 B1* | 9/2003 | Sakaguchi et al. | 438/695 |

FOREIGN PATENT DOCUMENTS

| | | | |
|---|---|---|---|
| EP | 0 558 925 A1 | | 9/1993 |
| EP | 0 807 970 A1 | | 11/1997 |
| EP | 0 829 559 A1 | | 3/1998 |
| EP | 0 895 282 A2 | | 2/1999 |
| EP | 0 905 767 A1 | | 3/1999 |
| EP | 0 966 034 A1 | | 12/1999 |
| EP | 1 045 448 A1 | | 10/2000 |
| EP | 1 193 740 A2 | | 4/2002 |
| JP | 05-275358 | | 10/1993 |
| JP | 2000-349267 | | 4/2008 |
| WO | WO 01/36719 A1 * | | 5/2001 |

OTHER PUBLICATIONS

Izumi et al, C.M.O.S. Devices Fabricated on Buried SiO2 Layers Formed by Oxygen Implantation into Silicon, Electronics Letters, 31st Aug. 1987, vol. 14, No. 18, p. 593.

Weldon et al, Hydrogen-Induced Exfoliaton of Silicon, J. Vac. Sci. Technolo. B, vol. 15, No. 4, Jul./Aug. 1997, p. 1065-1073.

J. G. Park, Nature of Surface Defects in SOI Wafers: *Simox* vs. *Bonded SOI*, JSPS, 3. International Symposium on Advanced Science and Technology of Silicon Material, 2000, Kona, USA.

T. Yonehara, K. Sakaguchi and N. Sato, ELTRAN®: Epitaxial Layer Transfer, Electrochemical Society Proceedings vol. 99-3, 1999, p. 111-116.

Kiyofumi Sakaguchi and Takao Yonehara, SOI Wafers Based On Epitaxial Technology, Solid State Technology vol. 43, No. 6, 2000, p. 88-92.

Current et al., New Technologies for Silicon-On-Insulator, European Semiconductor, 22 (2) , Feb. 2000, p. 25-27.

Annalena Thilderkvist, Sien Kang, Martin Feurfanger and Igor J. Malik, Surface Finishing of Cleaved SOI Films Using Epi Technologies, IEEE International SOI Conference, Oct. 2000, Wakefield, USA.

Stanley Wolf and Richard N. Tauber, Silicion Processing for the VLSI Era, vol. 1: Process Technology, Second Edition, Lattice Press, Sunset Beach, California, © 2000.

Q.-Y. Tong and U. Gösele, Semiconductor Wafer Bonding: Sciene and Technology, John Wiley & Sons, Inc., © 1999.

Twan Bearda, Paul W. Mertens, Marc M. Heyns and Rüdiger Schmolke, Morphology Change of Artificial Crystal Originalted Particles, and the Effect of Gate Oxide Integrity, Japanese Journal of Applied Physics, vol. 39, pp. L841-L843, Part 2, No. 8B, Aug. 15, 2000.

R. Schmolke, M. Blietz, R. Schauer, D. Zemke, H. Oelkrug, W. V. Ammon, U. Lambert and D. Gräf, Advanced Silicon Wafers for 0.18 μm Design Rule and Beyond: Epi and fLASH!, The Electrochemical Society Proceedings vol. 2000-17, 20.

M. I. Current, S. W. Bedell, I. J. Malik, L. M. Feng, F. J. Henley, What is the Future of Sub-100nm CMOS: Ultrashallow Junctions or Ultrathin SOI?, Solid State Technology, Sep. 2000.

D. Gräf, U. Lambert, R. Schmolke, R. Wahlich, W. Siebert, E. Daub and W. V. Ammon, 300mm Epi PP-Wafer: Is There Sufficient Gettering?. Electrochemical Society Proceedings vol. 2000-17, p. 319-330.

W. V. Ammon, A. Ehlert, U. Lambert, D. Gräf, M. Brohl, P. Wagner, Gate Oxide Related Bulk Properties of Oxygen Doped Floating Zone and Czochralski Silicon, Electrochemical Society Proceedings vol. 94-10. p. 136-145.

Koji Sueoka and Masanori Akatsuka, Oxygen Precipitation Behavior and its Optimum Condition for Internal Gettering and Mechanical Strength in Epitaxial and Polished Silicon Wafers, Electrochemical Society Proceedings vol. 2000-17, p. 164-179.

International Technology Roadmap for Semiconductors, 2nd Edition, "Front End Processes".

Journal of Applied Physics, vol. 80, No. 4, 1996, p. 2113-2120.

F.G. Park, Nature of Surface Defects in SOI Wafers, *Simox* vs. *Bond SOI*, 2000, p. 660-666.

V. Lehmann, J. Electrochem. Soc., vol. 140, No. 10 Oct. 1993, pp. 2836-2843.

Stanley Wolf and Richard N. Tauber, Silicon Processing for the VLSI Era, vol. 1: Process Technology, Second Edition, Lattice Press, Sunset Beach, California © 2000.

Naoto Tate et al., Defect Reduction of Bonded SOI Wafters by Post Anneal Process in $H_2$ Ambient, Proceedings 1998 IEEE International SOI Conference, Oct. 1998.

Hiroji Aga et al., "Study of HF Defects in Thin, Bonded Silicon-on-Insulator Dependent on Original Wafers", Jpn. J. Appl. Phys., vol. 38 91999) pp. 2694-2698.

M.L. Alles et al., "Analysis of Thin Film SOI Material Defect Requirements for Advanced Circuit Applications", Proceedings 1997 IEEE International SOI Conference, Oct. 1997, pp. 128-129.

Patent Abstracts of Japan JP 2000-349267 A.

Patent Abstracts of Japan JP 05-275358.

* cited by examiner

1 μm

1 μm

FILM OR LAYER OF SEMICONDUCTING MATERIAL, AND PROCESS FOR PRODUCING THE FILM OR LAYER

CROSS-REFERENCE TO RELATED APPLICATION

This application is a division of and claims priority to U.S. application Ser. No. 10/481,537 filed Dec. 18, 2003, U.S. Pat. No. 7,052,948 a National Stage of PCT/EP02/07125 filed Jun. 27, 2002, and also claims priority to German application DE 101 31 249.0 filed Jun. 28, 2001.

BACKGROUND OF THE INVENTION

1. Field of the Invention

The invention relates to a film or layer of semi-conducting material and to a process for producing the film or layer.

2. Description of the Related Art

What are known as SOI (silicon on insulator) wafers have a layer structure generally comprising a carrier, for example a silicon wafer, a layer of oxide which is buried just below the surface and a thin layer of silicon on top of the layer of oxide. For the fabrication of electronic components (e.g. memories and microprocessors), this layer structure has significant advantages over the silicon wafers which are customarily used:

A better characteristic of the electronic functions is achieved, in combination with high switching speeds and a lower power consumption on the part of the component. Moreover, components which are fabricated on the basis of SOI wafers are more suitable for operation at relatively low voltages than conventional components.

For these reasons, in future generations of components, the use of SOI wafers will increase significantly. The quality demands imposed on the SOI wafers are high, in particular with regard to the layer thickness homogeneity and the defect densities in the thin layer of silicon and in the oxide layer. In this context, the various production processes and products in accordance with the prior art also differ:

For example, in the case of what is known as the SIMOX process, a layer with a high oxygen content is produced by implantation of oxygen ions through the surface of a silicon wafer over a defined depth which is determined by the energy of the oxygen ions (Izumi et al., Electron Lett. 14 (18) (1978), p. 593). In a subsequent heat treatment, this layer is converted into a layer of silicon oxide which separates the thin layer of silicon above it from the remainder of the silicon wafer, which lies below it. However, the implantation of the oxygen ions produces crystal defects (damage) in the thin layer of silicon, and this damage has adverse effects on the SOI wafer during subsequent fabrication of electronic components.

Generally, however, SOI wafers are produced by transferring a thin layer of silicon from a first wafer, the substrate wafer, to a second wafer, the carrier wafer. Generally, both wafers consist of silicon. The thin layer of silicon is joined to the carrier wafer for example via an insulating silicon oxide layer. A number of processes which can be used to transfer thin layers of silicon from a first wafer to a second wafer and therefore produce an SOI wafer are known:

In what is known as the SMARTCut process (U.S. Pat. No. 5,374,564; Weldon et al., J. Vac. Sci. Technolo., B 15 (4) (1997), pp. 1065-1073), the separating layer is produced by means of hydrogen implantation, and after the bonding of the two wafers the separation (splitting) is carried out by means of a heat treatment. The result is a relatively rough surface with a large number of defects, which then has to be smoothed by polishing or heat treatment (annealing). In the process, irreparable defects (holes), known as HF defects, are also formed in the thin, upper layer of silicon, with a density of $0.1/cm^2$-$0.5/cm^2$. Furthermore, the implantation, the separating layer used and the separating process give rise to the formation of defects in the upper layer of silicon, which become visible after a Secco etching step (Secco etch defects) of an order of magnitude of $1 \cdot 10^2/cm^2$ to approximately $1 \cdot 10^4/cm^2$ (J. G. Park, "Nature of Surface Defects in SOI wafers: SIMOX vs. Bonded SOI", JSPS, 3. International Symposium on Advanced Science and Technology of Silicon Material, 2000, Kona, USA).

In what is known as the ELTRAN process (U.S. Pat. No. 5,854,123; Yonehara et al., Electrochem. Soc. Proc. 99-3 (1999) pp. 111-116), the separating layer is produced by means of an anodic etching process, with a porous surface layer being formed. This layer forms the separating layer. Then, an epitaxial layer, which forms the subsequent thin layer of silicon, is deposited on this porous layer. The separation is carried out thermally or mechanically, with defects once again being formed in the surface and in the upper layer of silicon. Furthermore, the epitaxial layer cannot grow on the porous surface without any defects at all. The HF defect density (holes in the thin layer of silicon) is $0.1/cm^2$-$0.3/cm^2$, the density of Secco etch defects is $5 \cdot 10^2/cm^2$-$1 \cdot 10^5/cm^2$, depending on the layer thickness of the silicon layer. The surface roughness after splitting is high, at 5 nm rms (scanning area 1 μm×1 μm) and requires subsequent smoothing processes (Sakaguchi et al., Solid State Technology 43 (6)· (2000) pp. 88-92).

A further process is known as the Nano-cleave process developed by SiGen, USA (Current et al., European Semiconductor, 22(2) (2000) pp. 25-27). This process requires an additional smoothing step after the separation in order to produce roughness values of below 0.2 nm rms (Thilderkvist et al., IEEE SOI Symposium, 2000, Wakefield, USA).

SUMMARY OF THE INVENTION

Therefore, complex further treatment steps are carried out in order to compensate for the above drawbacks. For example, according to EP 905767, the defect layer which has been produced by the cleaving of the silicon wafer along the layer of hydrogen bubbles, is removed from the SOI wafer by means of a vapor-phase etching process. This process at the same time allows the thickness of the silicon layer to be reduced if desired. The same effect is achieved by thermal oxidation of the silicon surface and subsequent removal by reduction of the silicon oxide, as described in EP 1045448. A heat treatment of the SOI wafer in a hydrogen-containing atmosphere is also possible, in order to smooth the surface of the thin layer of silicon and to anneal crystal defects (EP 1045448).

The invention is therefore based on the object of providing a film or layer of semiconducting material which is substantially free of crystal defects and has a smooth surface, and of providing a process for producing the film or layer.

The invention relates to a film or layer of semi-conducting material, wherein the defect density in the thin layer is less than $0.1/cm^2$ in the case of the HF defects and less than $10/cm^2$ in the case of the Secco etch defects.

Furthermore, the invention relates to an SOI wafer, comprising a carrier wafer and a thin layer of silicon, wherein the layer of silicon, after separation, has a surface roughness of less than 0.2 nm rms and a defect density of less than $0.1/cm^2$ in the case of the HF defects and less than $10/cm^2$ in the case of the Secco etch defects.

The invention also relates to an SOI wafer, comprising a carrier wafer and a thin layer of silicon, wherein the thin layer of silicon has a thickness of 20 nm or less and a thickness variation of 5% or less.

The invention also relates to a process for producing a film or a layer of semiconducting material, comprising the following steps:

a) the production of structures comprising periodically recurring recesses of predetermined geometries on the surface of a semiconducting material, b) heat treatment of the surface-structured material until a layer comprising periodically recurring cavities has formed beneath a closed layer at the surface of the material, c) separation of the closed layer at the surface from the remainder of the semiconducting material along the layer of cavities.

DETAILED DESCRIPTION OF THE PREFERRED EMBODIMENT(S)

In the process according to the invention, processes which are highly damaging to the crystal, such as ion implantation steps or ultra high temperature steps, and also coarse damage during the separating process, are avoided. The result is new, improved product properties with regard to the defects in the thin layer. In particular, there are no radiation-induced defects, i.e. defects caused by the particle radiation used during ion implantation, in the thin layer. The process according to the invention does not require any layers which contain implanted ions, i.e. hydrogen or oxygen ions.

The separation at the layer of cavities takes place without stresses. The gentle separating process means that little if any crystal damage is produced in the layer of semiconducting material. The result is new, improved product properties with regard to the defects in the thin layer of semiconducting material. Compared to the prior art, immediately after separation the smoother surfaces have a lower roughness value of 0.2 nm rms and considerably reduced defect densities of <0.1/cm$^2$ for HF defects and <10/cm$^2$ for Secco etch defects.

In the text which follows, the process according to the invention for producing a film or layer of a semi-conducting material is described with reference to the figures and in combination with preferred embodiments. The production process is illustrated as a combination of individual steps a) to c), it being possible, if necessary, for each individual step to encompass possible variations.

Figure 1:
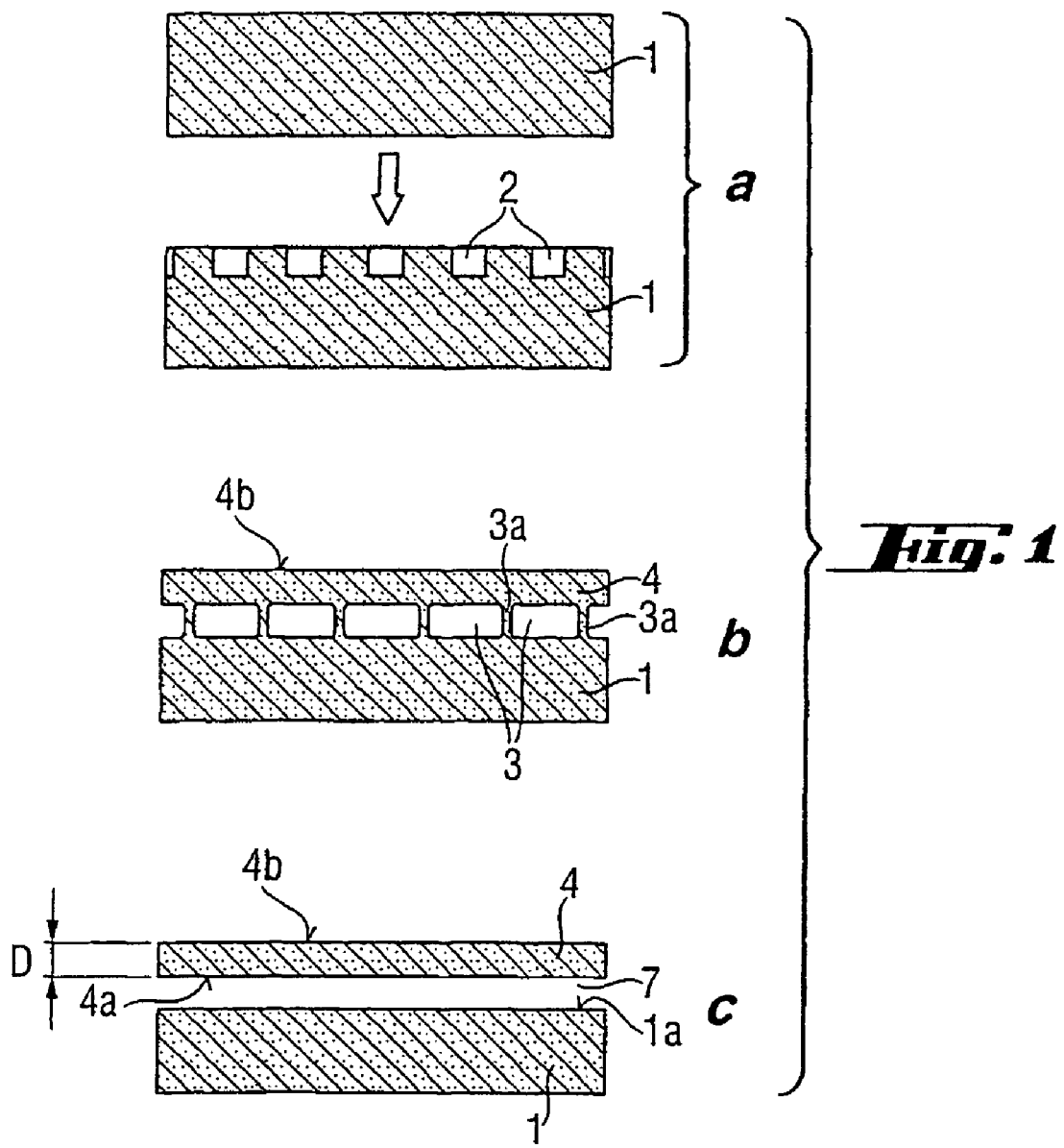
FIG. 1 diagrammatically depicts the sequence of the process according to the invention for producing a film or layer of semiconducting material.
Figure 2:
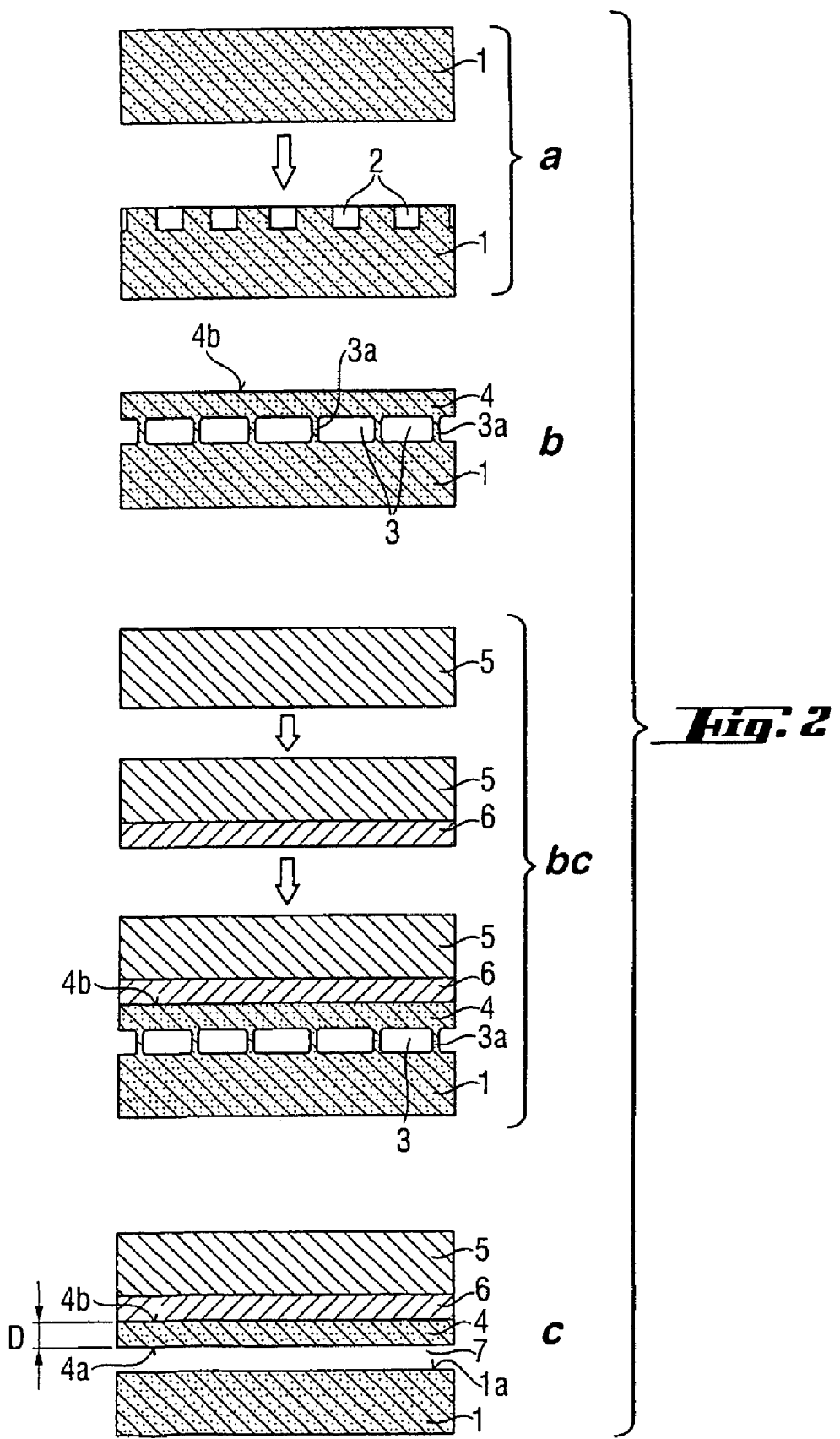
FIG. 2 shows the sequence of a preferred embodiment of the process according to the invention in which the film or layer is transferred to a carrier material.

In the first step a), structures comprising periodically recurring recesses 2 of predetermined geometries are produced on the surface, if appropriate including on part of the surface, of the semiconducting starting material (substrate) 1 (as diagrammatically illustrated in FIGS. 1 and 2).

The process can be applied to the desired semi-conducting materials, but preferably to silicon-germanium, gallium arsenide, silicon carbide and indium phosphide, particularly preferably to silicon. Since silicon is of particular importance in the fabrication of semiconductor components, the advantages and preferred embodiments of the process according to the invention are explained with reference to silicon, although application of the process is not restricted to silicon.

The substrate may also comprise various material specifications, with the formation of the region which is close to the surface in particular having a considerable influence on the subsequent quality of the semiconducting layer, since the film or layer of semi-conducting material is formed from the surface layer of the substrate.

It is preferable to use substrates in wafer form with planar surfaces. It is particularly preferable to use monocrystalline silicon wafers: CZ or FZ wafers (i.e. wafers produced from single crystals which have been manufactured using the Czochralski process or the floating zone process) with any desired doping and co-doping (for example nitrogen-doped wafers), wafers which are provided with an epitaxial layer, heat-treated wafers and material without significant voids and interstitial conglomerates (void-free silicon or perfect silicon) or pure-isotope silicon ($^{28}$Si).

A novel development is that, in addition to the known "polished" and "double-side polished (DSP)" surface qualities, it is possible to use wafers without haze-free polishing, fine-ground wafers or etched wafers.

The recesses 2 (FIGS. 1 and 2) are produced in the layer close to the surface in step a) using the known photolithography processes, the mask and exposure technique, trench etching by means of ion beam etching, plasma etching, with the aid of a laser or similar processes ("Silicon processing for the VLSI Era", S. Wolf, ISBN 0-961672-16-1). The dimensions of these recesses (trenches) 2 are accurately defined with regard to width, diameter, depth, shape and spacing. Holes, trenches or other regular or irregular geometric shapes are possible, regular shapes being preferred and substantially round or square holes being particularly preferred.

The recesses 2 are produced in a high density over a partial region of the surface or, preferably, substantially over an entire surface of the substrate 1. By way of example, in the case of substrates in wafer form, it is preferable for substantially the whole of one of the two surfaces to be provided with recesses. The recesses are produced in such a manner that structures comprising periodically recurring recesses of predetermined geometries are formed. The geometric dimensions (i.e. essentially the cross section, depth and spacing) of the recesses are selected in such a way that the layer of semiconducting material which is formed as the process continues acquires the desired thickness D. For this purpose, it is preferable for the diameter (in the case of round holes) or the edge length (in the case of square holes) to be selected to be D/5 to 2·D (particularly preferably D/3 to D), and for the trench depth to be selected to be D to 4·D and the trench spacing to be selected to be D/2 to 3·D.

The geometric dimensions of the recesses are, for example, selected in such a way that during the subsequent heat treatment in step b), the individual cavities 3 which are formed from the recesses can combine to form larger cavities 3. (The cavities illustrated in FIGS. 1 and 2 symbolize both the individual cavities and the larger cavities). In this case, it is preferable for the recesses to be produced at a small number of accurately positioned locations and at relatively large distances, so that after step b) webs 3a still remain in the cavity 3.

However, it is particularly preferable for the holes, which preferably all have the same geometry, to be produced in a regular, for example square or hexagonal, pattern with constant hole-to-hole distances and to dispense with greater distances at certain locations. In this case, the geometric dimensions of the holes and the hole-to-hole distance are preferably selected in such a way that, during the heat treatment in accordance with step b), the surface is closed off by a smooth layer, but the individual cavities formed from the individual recesses have not yet fused together to form larger cavities.

In the subsequent step b), the substrate is subjected to a heat treatment, which leads to the recesses 2 closing up at the surface on account of the surface mobility of the atoms, so that a closed layer 4 is formed, and at the same time cavities 3 are produced below the layer. As the process continues, the layer 4 above the cavities ultimately forms the layer or film of semiconducting material.

The technology on which steps a) and b) are based is described in the publication Tsunashima, Y., Sato, T. and Mizushima, I., Electrochem. Soc. Proc. 17 (2000), pp. 532-545.

Step b) is preferably controlled in such a way that where recesses have been produced in step a) a continuous cavity is formed, the layer 4 above the cavities 3 and the remainder of the substrate 1 being held together by deliberately constructed webs 3a at predetermined intervals. The webs are formed at the locations at which, in step a), greater distances were maintained between the recesses.

Figure 3:
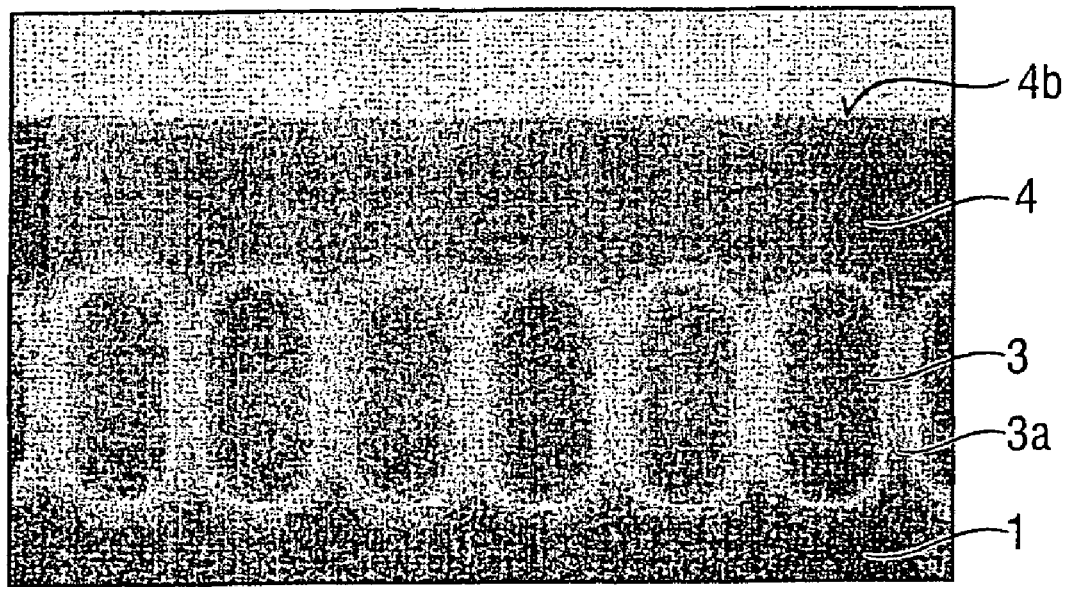
FIG. 3 shows an SEM (scanning electron microscope) image of a section through a silicon wafer which has been subjected to steps a) and b) in accordance with the invention.

If the recesses in step a) were produced without any greater distances at defined locations, which is a particularly preferred option, the heat treatment in step b) is controlled in such a manner that the surface of the layer 4 is closed up but the individual cavities which are formed from the individual recesses do not yet merge into one another. FIG. 3 shows an SEM image of a section through the correspondingly treated surface of a silicon wafer. It shows a closed layer 4 above a layer of individual cavities 3 which are formed from individual recesses.

Depending on the particular material, the heat treatment is carried out at between 200 and 1500° C., for 3 seconds to 6 hours, the time and duration being used to control the process in the manner which has been outlined above. The heat treatment can take place in all atmospheres which prevent the formation of a layer of oxide (native oxide) on the surface of the semi-conducting material, preferably in reducing gases or gas mixtures or inert gases and gas mixtures. An atmosphere which contains hydrogen or argon or mixtures of hydrogen and argon is preferred. The heat treatment may take place at atmospheric pressure or reduced pressure. The process conditions are selected in such a way that the highest possible surface mobility of the atoms of the semiconducting material can be achieved.

If silicon is used as the substrate, step b) is carried out with the following settings: temperature 700-1370° C., preferably 900-1250° C., particularly preferably 950-1150° C., pressure 1-100 torr, preferably 1-50 torr, particularly preferably 5-20 torr, duration 3 seconds to 6 hours, preferably 1 minute to 30 minutes. The heat treatment is carried out in a non-oxidizing atmosphere which preferably contains hydrogen or argon or a mixture of the two gases.

In step b), the process conditions are preferably selected in such a way that at the same time COPs (crystal originated pits, agglomerates of voids) in the substrate and in particular in the film or layer 4 above the cavities 3 are annealed at the same time. In the case of silicon, this requires temperatures of over 1000° C., as described in EP 829559 A1 or U.S. Pat. No. 5,935,320.

In addition, in this step the surface mobility of the atoms of the semiconducting material can be increased by gentle low-energy ion bombardment, which leads to the recesses being closed up more quickly or allows lower temperatures or shorter times to be employed.

In addition to the heat treatment, it is possible for an epitaxial layer to be deposited on the closed surface, either as part of the heat treatment or following the heat treatment. This makes it possible, for example, to shorten the process time. The deposition of an epitaxial layer is also useful if the surface of the substrate wafer is not sufficiently smooth, for example for optional subsequent bonding, after the heat treatment alone, which may have adverse effect on the bonding. It is known that an epitaxial layer with a thickness of <0.5 µm efficiently compensates for minor surface inhomogeneity, provided that the deposition temperature is selected within the range of temperatures which is suitable for the formation of cavities (T. Bearda, P. Mertens, M. M. Heyns, R. Schmolke, Jpn. J. Appl. Phys. 39 (2000) L841; R. Schmolke, M. Blietz, R. Schauer, D. Zemke, H. Oelkrug, W. v. Ammon, U. Lambert, D. Gräf, The Electrochem. Soc. PV2000-17 (2000) 3). A layer of semiconducting material which results from this process combination and which may be allowed to exceed the target thickness, with a view of total costs, can be reduced in size in a reproducible and controlled manner using a suitable subsequent treatment as described in the further context.

The layer or film 4 of semiconducting material which is to be produced has a relatively low mechanical stability, on account of its low thickness. Therefore, it is preferable for the surface of the substrate beneath which the layer of cavities has been produced to be joined, in a further step bc), to the surface of a carrier material 5 (bonding), as diagrammatically illustrated in FIG. 2. The carrier material is an electrically insulating solid body or at least bears an electrically insulating layer 6 at the surface. The carrier material used is preferably a material selected from the group consisting of silicon carbide, silicon-germanium, gallium arsenide, quartz, plastic, glass or ceramics. Silicon is particularly preferred as carrier material. In the case of silicon, an electrically insulating layer of silicon oxide is particularly preferred at the surface. It is also preferable for the surfaces of substrate and carrier material which are joined to one another to have the same geometric dimensions. It is also preferred for the carrier material to be in wafer form.

The carrier material may already include an incorporated internal getter, which bonds metallic impurities which have been introduced during the component process and keeps them away from the active region of the component.

The semiconducting material 1 and the carrier material 5 are joined using the processes which are known from the prior art (Q.-Y. Tong and U. Gösele: "Semiconductor wafer processing", ISBN 0-471-57481-3).

In the final step c), the layer or film 4 is separated from the remainder of the substrate 1, specifically along the layer of cavities 3. On account of these cavities, the separation is very gentle on the material compared to other processes. The separation is preferably carried out thermally, in which case the cavities merge so that the separation takes place particularly gently.

Particularly in the case of thermal separation, the individual, small cavities which are formed from the trenches must not yet merge completely during bonding, in order to ensure the mechanical stability of the substrate wafer for this operation. The individual, small cavities may only fuse together to form at best one large cavity in a thermal process which is carried out after or during the bonding process. This second thermal step for separation purposes involves, if the substrate consists of silicon, a heat treatment in the temperature range from 800 to 1370° C., preferably from 900 to 1200° C., for a duration of 3 s to 4 h, preferably from 1 to 30 min. What is known as a vertical furnace or an RTA installation (lamp furnace for rapid thermal anneal) is used, by way of example. The heat treatment takes place at atmospheric pressure or reduced pressure in any desired gas atmosphere, preferably in a reducing or inert gas atmosphere, particularly preferably in an atmosphere which contains hydrogen or argon or a mixture of hydrogen and argon. To achieve further homogenization and smoothing of the thin layer, it may be appropriate to lengthen the duration of the heat treatment.

However, there are also other known processes which can be used to allow separation along the fused cavities. Among mechanical processes, mention should be made of separation by means of a jet of fluid (Sakaguchi et al., Solid State Technology 43 (6) (2000), pp. 88-92), the use of shear forces (Current et al., "Ultrashallow junctions or ultrathin SOI?", Solid State Technology, September 2000) and acoustic separation methods (using ultrasound or megasound). Chemical cleaving by removing the webs which have remained between the cavities by etching using suitable gases or liquids (e.g. hydrofluoric acid or mixtures of nitric acid and hydrofluoric acid) is also possible. A combination of various separating methods is also possible.

A combination of step c) with the application of an epitaxial layer to the surface of the semiconducting material in an epitaxy reactor is preferred, so that it is possible to establish the desired target thickness of the layer or film.

The process according to the invention has proven particularly advantageous for the production of SOI structures. It makes it possible, for example, to use silicon wafers as substrate, which have been produced from crucible-pulled single crystals (CZ wafers). According to the prior art, these lead to the COPs which are present in the silicon wafers also being present in the thin layer of silicon of a SOI wafer produced therefrom, which leads to problems in component fabrication. For this reason, according to the prior art it is expedient for the substrate wafers used to be silicon wafers which have been produced from single crystals which have been pulled without the use of a crucible, using the floating zone process (FZ wafers). If this stipulation is not observed, the COPs in the thin layer of silicon have to be annealed by means of a heat treatment, preferably in a hydrogen atmosphere, after the production of the SOI wafer. By contrast, in the process according to the invention, it is also possible for CZ wafers to be used without problems as substrate wafers, since during the thermal closing of the surface in step b), the COPs can be annealed at the same time, which is particularly preferred.

A further advantage of the process according to the invention consists in the fact that, by using a suitable arrangement and shape of the recesses produced in step b), it is even possible to produce SOI wafers with ultrathin silicon layers with a thickness of 50 nm or less. It is in principle possible, while maintaining the depth/width ratio of the individual recess, for the silicon wafer produced to be thinner and smoother the smaller the cross section of and distance between the recesses.

The relationship between the geometric parameters of the recesses and the thickness of the thin layer of silicon which is to be produced can be determined experimentally by varying the geometric parameters. The periodic structure which is required for the thickness range below 50 nm can be achieved, for example, by the Nano-imprint process, electron beam lithography, X-ray lithography or extreme UV lithography. In future, it will be possible for the periodic structuring to be carried out with a high level of accuracy even in the range of 50 nm and below, on account of advances made in the photolithography field (further, newer processes are being developed), so that the variation in the thickness of thin layers of this type can be reduced to less than 5%.

Even now, the processes mentioned above can achieve geometric structures with geometric tolerances of $\leq 10\%$, preferably $\leq 5\%$ and particularly preferably $\leq 1\%$. The tighter the tolerances of the geometric structures, the better the resulting layer thickness homogeneity becomes. The tolerance of the layer thickness is generally lower than the tolerance of the individual geometric structures. This makes it possible to achieve layer thickness homogeneities of 5% and less.

The substantial avoidance of defects and the high surface quality of the thin layer of silicon makes it possible to reduce or completely eliminate complex further processing steps, which leads to a considerable reduction in costs for the production of the SOI wafers.

After the SOI wafer has been produced, it is possible, if necessary, to adjust, i.e. increase or reduce, the thickness of the silicon layer 4. To increase the layer thickness it is possible, for example, to deposit an epitaxial layer of silicon. A reduction in the layer thickness is possible with the known polishing processes, but preferably with vapor-phase etching or surface oxidation with subsequent removal by reduction of the silicon oxide layer. The homogeneity of the layer thickness is retained, so that layer thicknesses of 20 nm or less can be obtained with a layer thickness homogeneity of 5% or less.

Then, if necessary it is also possible for the roughness of the surface to be reduced. This may involve either a polishing step or a further heat treatment. This takes place in a reducing or inert atmosphere, which preferably contains hydrogen or argon or a mixture of hydrogen and argon, at atmospheric pressure or reduced pressure, in the temperature range between 1000 and 1250° C. for 10 seconds to 60 minutes in a batch furnace or lamp furnace (rapid thermal annealer, RTA). Batch furnaces are vertical furnaces or horizontal furnaces with boats for 50-250 silicon wafers per run. RTA are lamp furnaces for annealing in each case one wafer per run in cassette to cassette operation.

Particularly advantageous properties of the SOI wafer can be achieved by the following preferred embodiments of the process according to the invention:

When a FZ wafer is used as substrate wafer, it is possible to obtain a SOI wafer with a thin layer of silicon which is not only free of voids, but also is BMD-free. BMDs (bulk micro defects) are oxygen precipitates, while voids are conglomerates of crystal vacancies.

If the substrate wafer used is a highly nitrogen-doped CZ wafer, it is possible to achieve a higher resistance to slipping and formation of dislocations compared to conventional CZ wafers. Highly nitrogen-doped CZ wafers are CZ wafers with a nitrogen content of $1 \cdot 10_{14}$-$5 \cdot 10^{15}/cm^3$. Compared to CZ wafers without any nitrogen, highly nitrogen-doped wafers have a significantly increased resistance to thermally induced slipping and dislocations and have higher BMD densities (Gräf et al., ECS PV 2000-17, pp. 319-330; Ammon et al., ECS PV 94-10, p. 136; Sueoka et al., ECS PV 2000-17, pp. 164-179).

A further possibility is to use a different carrier material from monocrystalline silicon, e.g. poly-crystalline silicon, glass or ceramic.

The process according to the invention can also be employed particularly advantageously for the production of structures which comprise a plurality of layers or films. For this purpose, the process is carried out at least twice in succession; after the first pass, the carrier material with the first layer of semiconducting material located thereon is used once again as carrier material, so that one or more further layers are applied to the first layer.

EXAMPLE

The smooth, planar surface of a silicon wafer 1 (FIG. 2) was provided with periodically recurring recesses (trenches) 2 in step a) of the process according to the invention. The trenches had a square cross section with an edge length of approx. 0.5 μm, and the trench-to-trench distance was approx. 0.9 μm. The trenches were arranged in a regular, square pattern. The trenches were produced by ion beam etching in accordance with the prior art, in such a manner that a trench depth of 3 μm resulted.

Then, the structured surface of the silicon wafer 1 was in step b) closed up by means of a heat treatment which lasts for 10 minutes in a pure hydrogen atmosphere under a pressure of 10 torr, and with a hydrogen flow rate of 10 sccm and a temperature of 1100° C. In the process, the cavities 3 formed from the trenches 2 were widened by approx. 0.25 μm parallel to the closed surface 4 of the wafer. FIG. 3 shows an SEM image of the cavities 3 which have formed and of the closed, perfect and smooth layer 4 above them. This closed surface is particularly suitable for joining to a carrier wafer (bonding) in accordance to FIG. 2, on account of its smoothness.

The silicon wafer which was prepared in step b) was then, in a further step bc), joined by means of its surface 4b to a carrier wafer 5, which likewise consists of silicon and is provided with a layer 6 of silicon oxide, using a commercially available bonder produced by EVG, Schärding, Austria.

Figure 4:
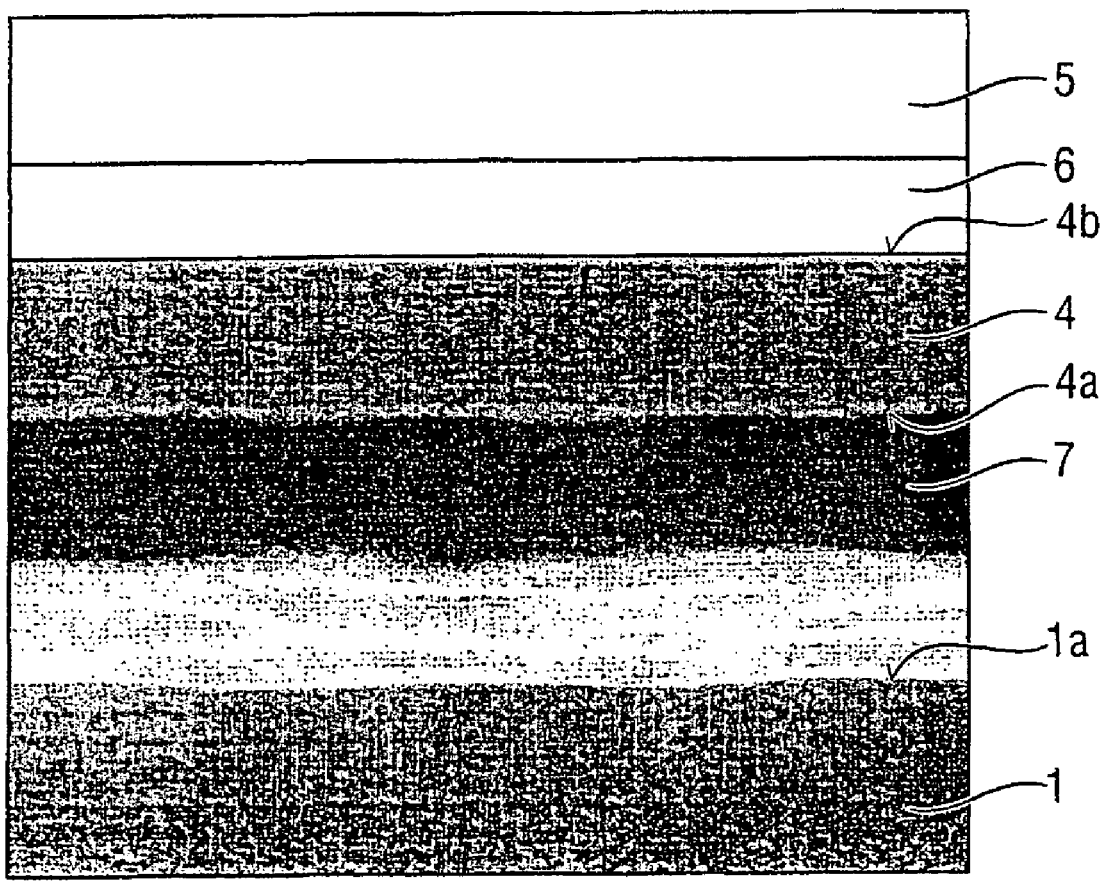
FIG. 4 shows an SEM image of the silicon wafer illustrated in FIG. 3 after it has been subjected to the separating step c).

In step c), the silicon wafers which had been joined via the silicon oxide layer 6 were subjected to a further heat treatment. For this heat treatment, the same conditions were selected as those used to close up the surface in step b). This heat treatment caused the cavities 3 illustrated in FIG. 3 to fuse together, so that a continuous cavity 7 (FIG. 4) was formed and the silicon layer 4 which still covered the cavities 3 in FIG. 3 was separated. FIG. 4 shows the newly formed surface 1a of the substrate silicon wafer 1, above which there is a continuous cavity 7 which completely separates the thin layer of silicon 4 which has been produced from the silicon wafer 1. The thin layer of silicon 4 is now only joined to the oxide layer 6 of the carrier silicon wafer 5 (5 and 6 illustrated diagrammatically). The thickness of the layer 4 is approx. 1 μm, and the layer rests loosely on the remaining part of the substrate 1. Unlike the surface 1a of the remaining part of the substrate, the surface 4a of the thin layer of silicon 4 which has been separated is already very smooth. The focus of FIG. 4 is on the surface 4a, which is provided for the fabrication of electronic components.

The invention claimed is:

1. A semiconductor-on-insulator wafer comprising a carrier wafer and a thin semiconductor layer with an insulator layer disposed therebetween, the thin semiconductor layer having a thickness of ≦20 nm, an HF defect density of ≦0.1/cm$^2$, and a surface roughness of an exposed surface of the thin semiconductor layer of ≦0.2 nm RMS, which has <10/cm$^2$ of secco etch defects.

2. The semiconductor-on-insulator wafer of claim 1, which is free of radiation-induced damage in the thin semiconductor layer.

3. The semiconductor-on-insulator wafer of claim 1, which has a thickness variation of the thin semiconductor layer of 5% or less.

4. The semiconductor-on-insulator wafer of claim 1, wherein the thin semiconductor layer comprises single crystal silicon grown by the FZ process, and wherein the thin semiconductor wafer is free of voids and free of BMDs.

5. The semiconductor-on-insulator wafer of claim 1, wherein the thin semiconductor layer comprises single crystal silicon grown by the CZ process, and the thin semiconductor layer is free of COPs.

6. The semiconductor-on-insulator wafer of claim 1, wherein said thin semiconductor layer comprises single crystal silicon having a nitrogen dopant concentration of from $1 \cdot 10^{14}$ atoms/cm$^3$ to $5 \cdot 10^{15}$ atoms/cm$^3$.

7. The semiconductor-on-insulator wafer of claim 1, wherein the carrier wafer comprises single crystal silicon, the insulating layer comprises silicon oxide, and the thin semiconductor layer comprises single crystal silicon.

8. An SOI wafer, comprising a carrier wafer and a thin layer of silicon, wherein the silicon layer, after separation, has a surface roughness of less than 0.2 nm rms and a defect density of less than 0.1/cm$^2$ in the case of the HF defects and less than 10/cm$^2$ in the case of the Secco etch defects.

9. The SOI wafer of claim 8, wherein the thin layer of silicon has a thickness of 50 um or less, a thickness variation of 5% or less, and a density of HF defects of less than 0.1/cm$^2$.

10. The SOI wafer of claim 8, wherein the thin layer of silicon has a thickness of 20 nm or less.

\* \* \* \* \*